United States Patent [19]

Kato

[11] Patent Number: 5,089,549

[45] Date of Patent: Feb. 18, 1992

[54] POLYIMIDE RESIN SOLUTION COMPOSITIONS

[75] Inventor: Hideto Kato, Takasaki, Japan

[73] Assignee: Shin-Etsu Chemical Co., Ltd., Tokyo, Japan

[21] Appl. No.: 427,367

[22] Filed: Oct. 27, 1989

[30] Foreign Application Priority Data

Nov. 2, 1988 [JP] Japan .................. 63-276310

[51] Int. Cl.$^5$ ............................... C08K 5/09
[52] U.S. Cl. .................... 524/287; 528/26; 524/284; 524/600; 524/376; 524/588
[58] Field of Search ................ 528/26; 524/284, 287, 524/600, 376, 588

[56] References Cited

U.S. PATENT DOCUMENTS

| | | | |
|---|---|---|---|
| 3,325,450 | 6/1967 | Holub | 528/21 |
| 4,495,321 | 1/1985 | Arnold | 524/600 |
| 4,586,997 | 5/1986 | Lee | 528/26 |
| 4,758,476 | 7/1988 | Sekine et al. | 528/26 |
| 4,939,223 | 7/1990 | Yameda et al. | 528/28 |

*Primary Examiner*—Paul R. Michl
*Assistant Examiner*—Karen A. Hellender
*Attorney, Agent, or Firm*—Birch, Stewart, Kolasch & Birch

[57] ABSTRACT

A specific polyimide resin is provided which is soluble in low-boiling organic solvents. Polyimide resin films having improved adhesion, heat resistance, electrical and mechanical properties are prepared from solutions of the polyimide resin through a brief heat treatment.

20 Claims, No Drawings

POLYIMIDE RESIN SOLUTION COMPOSITIONS

This invention relates to polyimide resin solution compositions useful in forming insulating protective films on electronic parts.

BACKGROUND OF THE INVENTION

Polyimide resins generally have excellent heat resistance, but are insoluble in commonly used solvents other than certain high-boiling organic solvents. In order to utilize polyimide resins as coating material for electronic parts or the like, a special method for forming a polyimide resin film must be employed involving dissolving a polyamic acid which is a polyimide precursor in an organic solvent, applying the solution to a substrate to form a thin coating, and heating the coating at elevated temperatures for an extended period of time, thereby curing the coating into a polyimide film. More particularly, such a polyimide resin film is most often prepared by effecting addition reaction of a tetracarboxylic acid dianhydride and an aromatic diamine in an organic solvent to form a polyamic acid or a polyimide precursor. The reaction product is applied to substrates or articles, for example, electronic parts as a thin coating. The coated substrates are heat treated at elevated temperatures of at least 300° C. for an extended period of time, thereby achieving imidization into a polyimide film through dehydration.

This method, however, suffers from several drawbacks. Heating at elevated temperatures for an extended period of time is disadvantageous as a commercial process, especially from the standpoint of energy saving. If heating is insufficient, the resulting polyimide resin will have polyamic acid left therein which later causes degradation of the polyimide resin, often inviting humidity and corrosion resistance losses. Particularly when the polyimide resin film is applied to electronic parts as an insulating protective film, such a degraded resin gives rise to serious problems including deterioration of electronic parts and reduced lifetime.

One possible approach for overcoming these problems is the use of a polyimide resin soluble in an organic solvent. The resin solution is applied to a substrate. The coated substrate is heated to evaporate off the solvent, leaving a resin film.

Several methods have been proposed for preparing such organic solvent soluble polyimide resins. For example, Japanese Patent Publication No. 26878/1972, Japanese Patent Application Kokai Nos. 65227/1980, 187430/1983, 35026/1985, and 197731/1985 disclose that polyimide resins soluble in phenolic solvents such as phenol and halogenated phenols are prepared by heating a tetracarboxylic acid dianhydride and an aromatic diamine in such a solvent. Japanese Patent Publication No. 30319/1977 and Japanese Patent Application Kokai Nos. 83228/1986 and 18426/1987 disclose that polyimide resins soluble in polar solvents such as N-methyl-2-pyrrolidone are prepared using a specific tetracarboxylic acid dianhydride and a specific diamine.

These methods also have several drawbacks. When it is desired to use the polyimide resin prepared by the former method, the resin is dissolved in a phenolic solvent to form a coating composition which generates an irritative odor like cresol odor upon evaporation of the solvent. Contact of the solvent to the skin causes chemical burn. Thus this coating composition requires careful handling and is less safe or hygienic. Where the polyimide resin prepared by the latter method is used as a solution in a polar solvent such as N-methyl-2-pyrrolidone, a diamine such as toluene diamine which disorders the crystallinity of the resin must be used to render the resin soluble at the sacrifice of electrical properties and toughness inherent to the polyimide resin. Polar organic solvents such as N-methyl-2-pyrrolidone have such a high boiling point that a heat treatment must be carried out at elevated temperatures for an extended period of time in order to fully remove the solvent at the sacrifice of operation efficiency.

SUMMARY OF THE INVENTION

Therefore, an object of the present invention is to provide a novel and improved polyimide resin solution composition which has eliminated the above-mentioned drawbacks. Another object of the present invention is to provide a novel and improved polyimide resin solution composition in which the polyimide resin is soluble in low-boiling, highly volatile organic solvents whereby a polyimide resin film having improved adherence, heat resistance, electrical and mechanical properties can be readily formed from the composition through a brief heat treatment at a relatively low temperature. A further object of the present invention is to provide a novel and improved polyimide resin solution composition which is safe and stable during shelf storage.

In order to achieve these objects, the inventor made efforts to provide polyimide resins with solubility in low-boiling organic solvents. We have discovered that polyimide resins consisting essentially of 100 to 30 mol% of recurring units having formula (1):

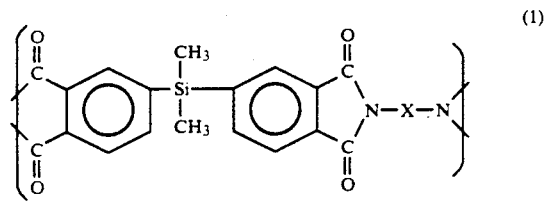

wherein X is a divalent organic group, and 0 to 70 mol% of recurring units having formula (2):

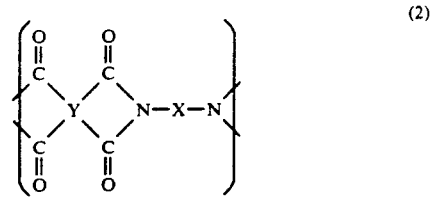

wherein X is as defined above and Y is a tetravalent organic group containing an aromatic ring, especially polyimide resins as defined above wherein the divalent organic group represented by X in both the recurring units (1) and (2) is a divalent organic group comprising 100 to 10 mol% of a unit of formula (3):

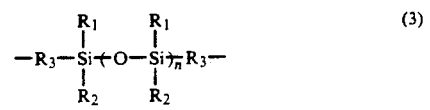

wherein $R_1$ and $R_2$ are independently selected from monovalent organic groups having 1 to 18 carbon atoms, $R_3$ is a divalent organic group having 1 to 18 carbon atoms, and letter n is an integer of from 1 to 100, and 0 to 90 mol% of a unit of an aromatic diamine compound residue having 6 to 35 carbon atoms are well soluble in low-boiling organic solvents of ether, ketone, ester, cellosolve and other types; and that polyimide resin films having improved properties can be readily obtained from solution compositions of the polyimide resins in these organic solvents through a brief heat treatment at a relatively low temperature.

The polyimide resin having recurring units of formula (1) can be prepared by reacting a silicon-containing tetra-carboxylic acid dianhydride in the form of bis(3,4-dicarboxyphenyl)dimethylsilane dianhydride of formula (A):

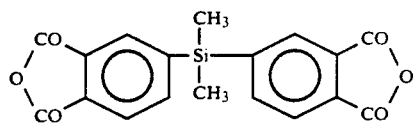
(A)

optionally in admixture with another aromatic tetra-carboxylic acid dianhydride with a diamine, preferably a diaminosiloxane of formula (B):

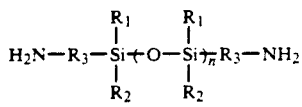
(B)

optionally in admixture with an aromatic diamine. The use of bis(3,4-dicarboxyphenyl)dimethylsilane dianhydride of formula (A) imparts solvent solubility to polyimide resins which are otherwise insoluble in common solvents other than special solvents as typified by phenolic solvents and N-methyl-2-pyrrolidone. The polyimide resins having recurring units of formula (1) are soluble in low-boiling solvents so that polyimide resin films can be prepared from solutions of the resins in low-boiling solvents by heating to a relatively low temperature for a reduced time. This promises a significant improvement in application, an energy saving, and a cost reduction as well as an advantage from a hygienic or safety aspect.

Since the polyimide resins defined above contain silicon in the tetracarboxylic acid dianhydride component, and even a siloxane in the diamine moiety when X is a divalent organic group of formula (3), they form films having improved adherence, heat resistance, electrical and mechanical properties. Further, since the polyimide resins defined above is free of a functional group capable of inducing gelation, they remain stable in solvents without a change during prolonged shelf storage.

Based on the above finding, the present invention provides a polyimide resin solution composition comprising a polyimide resin consisting essentially of 100 to 30 mol% of recurring units having formula (1) and 0 to 70 mol% of recurring units having formula (2), and an organic solvent of ether, ketone, ester, cellosolve or similar type.

DETAILED DESCRIPTION OF THE INVENTION

The polyimide resin of the present invention contains 100 to 30 mol% of recurring units having formula (1):

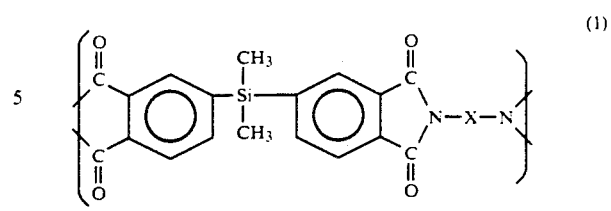
(1)

wherein X is a divalent organic group.

Preferably, the divalent organic group represented by X in formula (1) is a divalent organic group containing 100 to 10 mol% of a unit of formula (3):

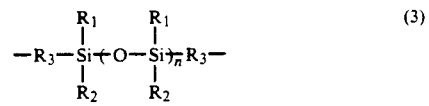
(3)

wherein $R_1$ and $R_2$ are independently selected from monovalent organic groups, $R_1$ and $R_2$ may be the same or different, $R_3$ is a divalent organic group, and letter n is an integer of from 1 to 100. The organic groups represented by $R_1$ and $R_2$ are preferably those having 1 to 18 carbon atoms, especially 1 to 6 carbon atoms, for example, alkyl groups such as methyl, ethyl, propyl, and butyl groups, cycloalkyl groups such as a cyclohexyl group, aryl groups such as phenyl and tolyl groups, and substituted ones of these groups wherein some or all of the hydrogen atoms are replaced by halogen atoms or the like, such as chloromethyl and 3,3,3-trifluoropropyl groups. The divalent organic groups represented by $R_3$ are preferably those having 1 to 18 carbon atoms, especially 1 to 7 carbon atoms, including alkylene, arylene, and aralkylene groups in all of which an oxygen or sulfur atom may intervene, for example,

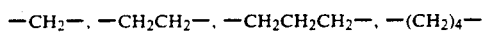

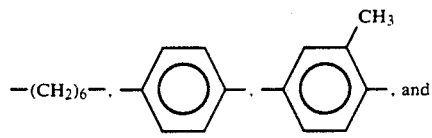

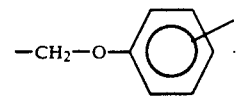

Several illustrative, non-limiting examples of the organic group of formula (3) are given below.

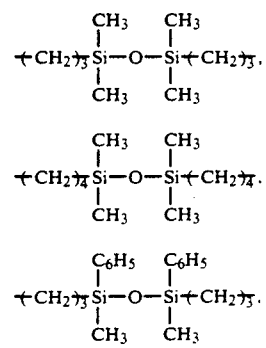

-continued

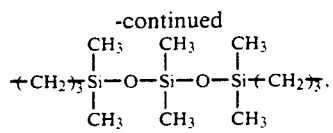

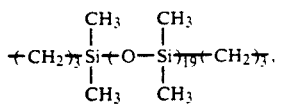

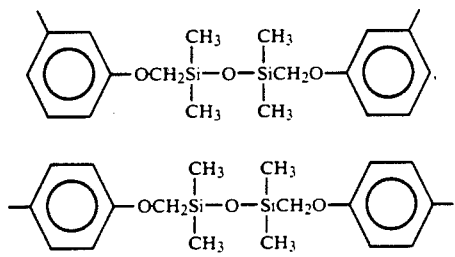

The balance of X is comprised of 0 to 90 mol% of an aromatic diamine compound residue having 6 to 35 carbon atoms as will be described later.

The content of the recurring units of formula (1) ranges from 100 to 30 mol%, preferably from 100 to 60 mol% of the polyimide resin.

In addition to the recurring units of formula (1), the polyimide resin of the invention may contain recurring units having formula (2):

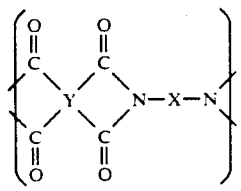 (2)

wherein X is a divalent organic group and Y is a tetravalent organic group containing an aromatic ring. The divalent organic groups represented by X are as defined above for formula (1) and preferably those organic groups of formula (3) as defined above. Examples of the tetravalent organic groups containing an aromatic ring represented by Y include residues of tetracarboxylic acid dianhydrides, for example,

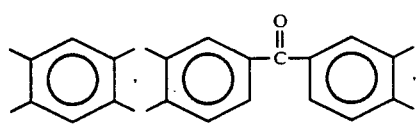

, and

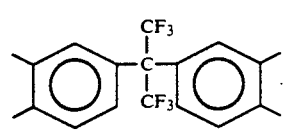

The content of the recurring units of formula (2) ranges from 0 to 70 mol%, preferably from 0 to 40 mol% of the polyimide resin in proportion to the content of the recurring units of formula (1).

The polyimide resin of the invention can be synthesized from an acid dianhydride component, bis(3,4-dicarboxy-phenyl)dimethylsilane dianhydride or a mixture thereof with a predetermined proportion of an aromatic tetracarboxylic acid dianhydride, the predetermined proportion being such that the above-defined proportion between the recurring units of formulae (1) and (2) is achieved, and a diamine component, preferably a diaminosiloxane and/or an aromatic diamine.

The aromatic tetracarboxylic acid dianhydrides used herein are not particularly limited although preferred examples thereof include pyromellitic dianhydride, benzophenonetetracarboxylic dianhydride, 3,3',4,4'-biphenyltetracarboxylic dianhydride, and 2,2'-bis(3,4-benzenedicarboxylic anhydride)perfluoropropane alone or in admixture of two or more.

The diamine component to be reacted with the acid anhydride component is preferably selected from diamino. siloxanes and aromatic diamines. From the standpoint of introducing an organic group of formula (3), preferred are diaminosiloxanes of formula (B):

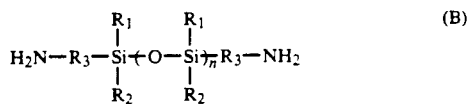 (B)

wherein $R_1$, $R_2$, $R_3$, and n are as defined above.

Several illustrative, non-limiting examples of the diaminosiloxane of formula (B) are given below.

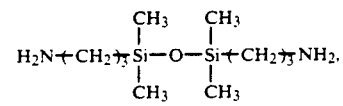

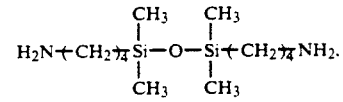

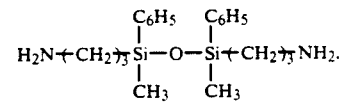

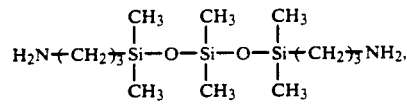

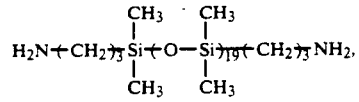

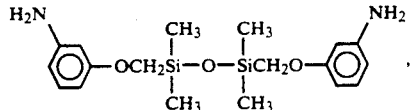

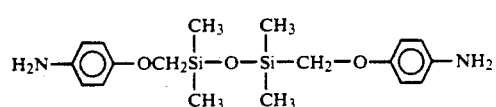

Another preferred diamine is an aromatic diamine. It is preferred to blend an aromatic diamine so as to occupy the remaining portion of the divalent organic group represented by X in formula (1). Although the aromatic diamine is not particularly limited, preferred examples thereof include
4,4'-diaminodiphenylmethane,
4,4'-diaminodiphenylether,
2,2'-bis(4-aminophenyl)propane,
4,4'-diaminodiphenylsulfone,
4,4'-diaminodiphenylsulfide,
1,4-bis(3-aminophenoxy)benzene,
1,4-bis(4-aminophenoxy)benzene,
1,4-bis(m-aminophenylsulfonyl)benzene,
1,4-bis(p-aminophenylsulfonyl)benzene,
1,4-bis(m-aminophenylthioether)benzene,
1,4-bis(p-aminophenylthioether)benzene,
2,2-bis[4-(4-aminophenoxy)phenyl]propane,
2,2-bis[3-methyl-4-(4-aminophenoxy)phenyl]propane,
2,2'-bis[3-chloro-4-aminophenoxy)phenyl]propane,
1,1-bis[4-(4-aminophenoxy)phenyl]ethane,
1,1-bis[3-methyl-4-(4-aminophenoxy)phenyl]ethane,
1,1-bis[3-chloro-4-(4-aminophenoxy)phenyl]ethane,
1,1-bis[3,5-dimethyl-4-(4-aminophenoxy)phenyl]ethane,
bis[4-(4-aminophenoxy)phenyl]methane,
bis[3-methyl-4-(4-aminophenoxy)phenyl]methane,
bis[3-chloro-4-(4-aminophenoxy)phenyl]methane,
bis[3,5-dimethyl-4-(4-aminophenoxy)phenyl]methane,
bis[4-(4-aminophenoxy)phenyl]sulfone, etc.
They may be used alone or in admixture of two or more.

Polymerization between the acid dianhydride and diamine components may be carried out by any well-known method. For example, tetracarboxylic acid dianhydride and diamine components are admitted into a polar organic solvent such as N-methyl-2-pyrrolidone, N,N'-dimethylformamide, N,N'-di-methylacetamide, dimethylsulfoxide, and hexamethylphosphoramide in amounts equal to the equivalents of the solvent or in a range of from 0.9 to 1.1 equivalents per equivalent of the solvent. The reaction mixture is maintained at a relatively low temperature (e.g., at 10° to 40° C. by cooling rather than heating because of exothermic reaction) for reaction to form a polyamic acid resin which is a polyimide resin precursor. The reaction product is heated to a temperature in the range of from 80° to 200° C., preferably from 140° to 180° C. without isolating the polyamic acid resin whereby a ring-closing reaction through dehydration takes place on an acid amide moiety of the polyamic acid, synthesizing the end polyimide resin. Since water is by-product during the reaction, an azeotropic dewatering solvent such as toluene or xylene are preferably added to the reaction solution to complete the dehydrating ring closing reaction within a short time. The progress of cyclopolymerization may be monitored by any well-known methods, for example, by detecting a change in the absorption band characteristic of an imide group in an infrared absorption spectrum (see Japanese Patent Publication No. 41330/1982). After imidization is completed through the dehydrating ring closure, the reaction solution is cooled down and poured into methanol to give a precipitate. After drying, there is obtained a polyimide resin according to the present invention.

The polyimide resins of the invention are well soluble in low-boiling organic solvents, for example, ethers such as diethyl ether, tetrahydrofuran, dimethoxyethane, and 1,4-dioxane; ketones such as acetone, dimethyl ketone, methyl isobutyl ketone, cyclohexanone, and acetophenone; esters such as ethyl acetate, butyl acetate, and methyl benzoate; and cellosolves such as diethylene glycol dimethyl ether and butyl acetate cellosolve. The polyimide resins as solutions in such solvents show good shelf stability without gelation. Such solutions can be readily processed into polyimide resin films having improved adherence, heat resistance, electrical and mechanical properties through a heat treatment at a relatively low temperature for a relatively short time.

The polyimide resin solution composition of the present invention remains stable at room temperature for an extended period of storage time because the polyimide resin is free of a functional group which will induce gelation. As opposed to conventional polyamic acid resin solutions, the polyimide resin solution composition of the invention can be applied to a substrate to form a polyimide resin film without a need for dewatering by an extended high-temperature heat treatment. More particularly, a protective film can be formed on a substrate from the polyimide resin solution composition of the invention simply by applying the solution composition to the substrate and heating the coated substrate at a temperature of about 150° C. for about ten minutes to about one hour, and evaporating off the solvent. The resulting polyimide resin film has excellent physical properties inherent to the polyimide resin and improved adhesion to the substrate.

The polyimide resin solution compositions of the invention may find a wide variety of applications, for example, as passivation films and protective films on semiconductor elements, junction protective films for diodes, thyristors, and transistors, wire shielding films and interlaminar insulating films for VLSI, ion implantation masks, conformal coatings on printed circuit boards, orienting films for liquid crystal display elements, fiber glass protecting films, surface protective films for solar batteries and the like.

There has been described a novel and improved polyimide resin solution composition which allows the use of low. boiling, highly volatile organic solvents of ether, ketone, ester and cellosolve types and mixtures thereof. The polyimide resin solution composition is stable for a long period of time. Polyimide resin films having improved adherence, heat resistance, electrical and mechanical properties can be readily formed by applying the composition to substrates such as electronic parts followed by a brief heat treatment at a relatively low temperature as compared with the prior art polyimide resin film preparation method requiring a prolonged heat treatment at elevated temperatures, the present invention presents a significant energy saving and a great commercial value.

EXAMPLE

Examples of the invention are given below by way of illustration and not by way of limitation. All percents are by weight unless otherwise stated.

EXAMPLE 1

A flask equipped with a stirrer, thermometer and nitrogen purging tube was charged with 17.60 grams of bis(3,4-dicarboxyphenyl)dimethylsilane dianhydride as a tetracarboxylic acid dianhydride component and 120 grams of N-methyl-2-pyrrolidone. Then 40.16 grams of a solution containing 1.24 grams of bis(3-aminopropyl)-tetramethyl-disiloxane and 8.92 grams of 4,4'-diaminodiphenylmethane as diamine components in N-methyl-2-pyrrolidone was added dropwise to the flask at such a rate that the temperature of the reaction system did not exceed 50° C. At the end of addition, the reaction mixture was stirred for a further 10 hours at room temperature. After a reflux condenser with a water reservoir was connected to the flask, 30 grams of xylene was added to the flask, which was heated to 160° C. The flask was maintained for 4 hours at the temperature for reaction, obtaining a yellowish brown clear polyimide resin solution. During the reaction 1.81 grams of water by-product was collected. Next, the polyimide resin solution was poured into methanol, from which a precipitate settled. The precipitate was collected and dried for 15 hours in vacuum at 60° C., yielding 24.3 grams of a polyimide resin having the following formula.

found in the aged solution. The solution was thus found to have excellent shelf stability.

The polyimide resin solution composition as prepared above was applied to various substrates including iron, nickel, aluminum, copper, glass, and silicon wafers and heated at 150° C. for 10 minutes, obtaining satisfactory films of about 20 μm thick having a smooth surface on all the substrates. A Scotch tape test was carried out on the coated substrates to give a rating of 100/100, indicating excellent adhesion.

EXAMPLE 2

The procedure of Example 1 was repeated except that the tetracarboxylic acid dianhydride component was a mixture of 12.32 grams of bis(3,4-dicarboxy-

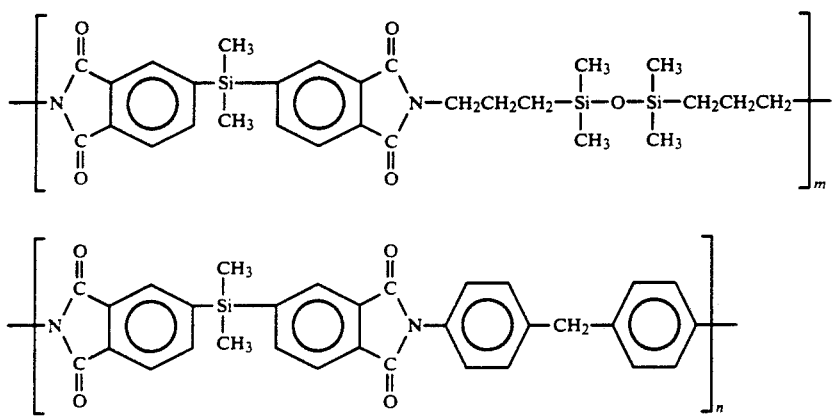

In the above formula, m:n is 10:90.

The infrared absorption spectrum of this polyimide resin showed absorption peaks at 1780 cm$^{-1}$ and 1720 cm$^{-1}$ attributable to an imide group, but no absorption attributable to polyamic acid.

The polyimide resin was found to be soluble in organic solvents of ether, ketone, cellosolve, and ester types including tetrahydrofuran, 1,4-dioxane, cyclohexanone, acetophenone, diethylene glycol dimethyl ether, gamma-lactone, and methyl benzoate.

A solution containing 10% by weight of the polyimide resin in tetrahydrofuran was prepared. This solution had a viscosity of 25 centistokes at 25° C. After the solution had been aged at room temperature for 6 months, it showed a viscosity of 25 centistokes at 25° C., remaining unchanged from the initial. No deposit was phenyl)dimethylsilane dianhydride and 4.83 grams of 3,3′,4,4′-benzophenonetetra-carboxylic acid dianhydride and the diamine component was a mixture of 3.73 grams of bis(3-aminopropyl)tetramethyl. disiloxane and 6.94 grams of 4,4-diaminodiphenylmethane. There was obtained 24.1 grams of a polyimide resin having the following compositional formula.

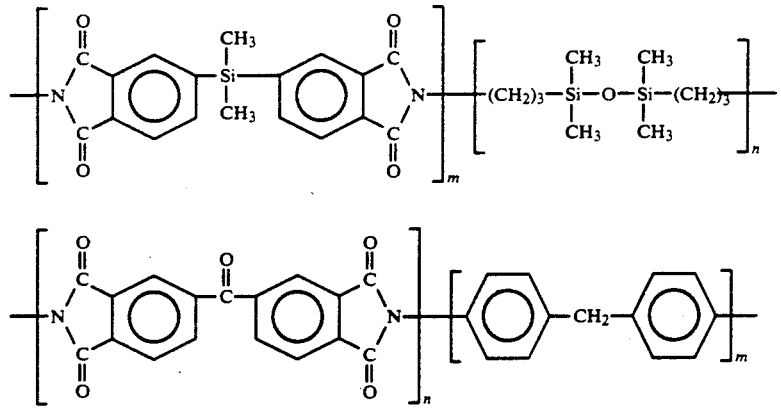

In the above formula, m:n is 70:30.

The polyimide resin was found to be soluble in numerous organic solvents of ether, ketone, cellosolve, and ester types.

A solution containing 10% by weight of the polyimide resin in 1,4-dioxane was prepared. This solution had a viscosity of 32 centistokes at 25° C. The solution was applied to various substrates as used in Example 1 and heated at 150° C. for 30 minutes, obtaining satisfactory films of about 20 μm thick having a smooth surface on all the substrates. The films showed good adhesion to the substrates.

EXAMPLE 3

The procedure of Example 1 was repeated except that the tetracarboxylic acid dianhydride component was a mixture of 5.28 grams of bis(3,4-dicarboxyphenyl)dimethylsilane dianhydride and 10.30 grams of 3,3',4,4'-biphenyltetra-carboxylic acid dianhydride and the diamine component was a mixture of 8.70 grams of bis(3-aminopropyl)tetramethyl disiloxane and 3.00 grams of 4,4'-diaminodiphenyl ether. There was obtained 23.6 grams of a polyimide resin having the following compositional formula.

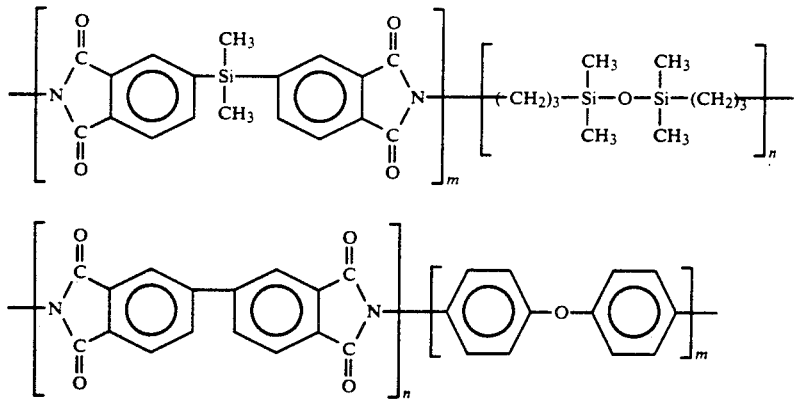

In the above formula, m:n is 30:70.

The polyimide resin was found to be soluble in numerous organic solvents of ether, ketone, cellosolve, and ester types.

A solution containing 10% by weight of the polyimide resin in methyl benzoate was prepared. This solution had a viscosity of 87 centistokes at 25° C. The solution was applied to various substrates as used in Example 1 and heated at 150° C. for one hour, obtaining satisfactory films of about 20 μm thick having a smooth surface on all the substrates. The films showed good adhesion to the substrates.

EXAMPLE 4

The procedure of Example 1 was repeated except that the tetracarboxylic acid dianhydride component was a mixture of 5.28 grams of bis(3,4-dicarboxyphenyl)dimethylsilane dianhydride and 10.30 grams of 3,3',4,4'-biphenyltetra carboxylic acid dianhydride and the diamine component was a mixture of 1.24 grams of bis(3-aminopropyl)tetramethyl disiloxane and 18.47 grams of 2,2-bis[4-(4-aminophenoxy)phenyl]propane. There was obtained 23.6 grams of a polyimide resin having the following compositional formula.

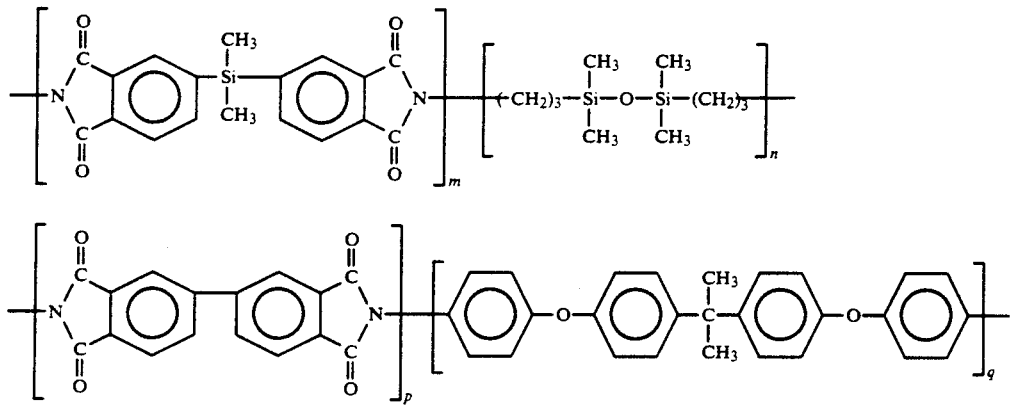

In the above formula, m:n:p:q is 30:10:70:90.

The polyimide resin was found to be soluble in numerous organic solvents of ether, ketone, cellosolve, and ester types.

A solution containing 15% by weight of the polyimide resin in cyclohexanone was prepared. This solution had a viscosity of 180 centistokes at 25° C. The solution was applied to various substrates as used in Example 1 and heated at 150° C. for one hour, obtaining satisfactory films of about 50 μm thick having a smooth surface on all the substrates. The films showed good adhesion to the substrates.

The solution was also applied to an iron plate and heated at 150° C. for one hour, obtaining a film which was measured for volume resistivity, dielectric strength, and dielectric constant. The cured film of this polyimide resin was found to have excellent electrical properties as shown below.

| Electrical properties | |
| --- | --- |
| Volume resistivity | $1.2 \times 10^{16}$ Ω-cm |
| Dielectric strength | 115 kV/mm |

-continued

| Electrical properties | |
|---|---|
| Dielectric constant | 3.05 |

The foregoing examples demonstrate that the polyimide resins according to the present invention are soluble in low-boiling solvents of ether, ketone, cellosolve, and ester types and polyimide resin films can be readily formed from resin solutions in such solvents through a brief mild heat treatment.

The polyimide resins of Examples 1 through 4 were found to have a thermal decomposition temperature of at least 400° C. in a nitrogen atmosphere, indicating excellent heat resistance.

Although some preferred embodiments have been described, many modifications and variations may be made thereto in the light of the above teachings. It is therefore to be understood that within the scope of the appended claims, the invention may be practiced otherwise than as specifically described.

I claim:

1. A polyimide resin solution composition comprising a polyimide resin consisting essentially of 100 to 30 mol% of recurring units having formula (1):

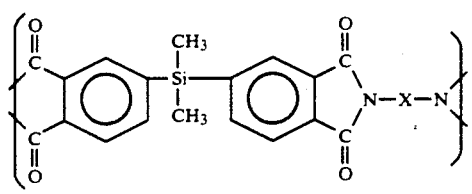

(1)

wherein X is a divalent organic group, and 0 to 70 mol% of recurring units having formula (2):

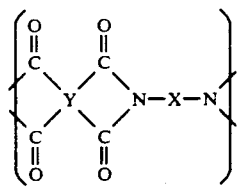

(2)

wherein X is as defined above and Y is a tetravalent organic group containing an aromatic ring, and a solvent in which said polyimide resin is soluble.

2. The composition of claim 1 wherein X in both the recurring units (1) and (2) is a divalent organic group comprising 100 to 10 mol% of a unit of formula (3):

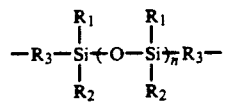

(3)

wherein $R_1$ and $R_2$ are independently selected from monovalent organic groups having 1 to 18 carbon atoms, $R_3$ is a divalent organic group having 1 to 18 carbon atoms, and letter n is an integer of from 1 to 100, and 0 to 90 mol% of a unit of an aromatic diamine compound residue having 6 to 35 carbon atoms, and Y in the recurring unit (2) is selected from the group consisting of

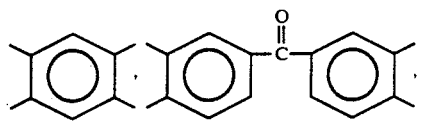

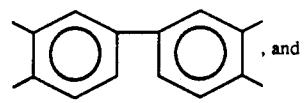, and

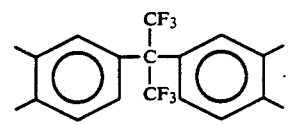

3. The composition of claim 1, wherein said solvent is a low boiling organic solvent selected from the group consisting of an ether, a ketone, an ester, diethylene glycol dimethylether, and butyl acetate cellosolve.

4. The composition of claim 3, wherein said solvent is selected from the group consisting of diethylether, tetrahydrofuran, dimethoxyethane, 1, 4-dioxane, acetone, dimethyl ketone, 1,4-dioxane, acetone, dimethylketone, methyl isobutyl ketone, cyclohexanone, acetophenone, ethylacetate, butyl acetate, methyl benzoate, and butyl acetate cellosolve.

5. The composition of claim 1, wherein said polyimide resin having recurring units of formula (1) is prepared by reacting a silicon-containing tetracarboxylic acid dianhydride in the form of bis (3,4-dicarboxyphenyl)dimethylsilane dianhydride of formula (A):

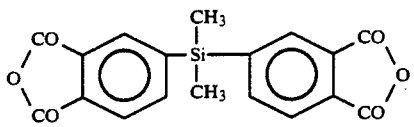

(A)

optionally in admixture with another aromatic tetracarboxylic acid dianhydride with a diamine, optionally in admixture with an aromatic diamine.

6. The composition of claim 5, wherein said diamine is a diaminosiloxane of formula (B):

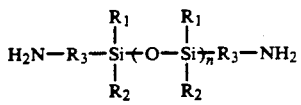

(B)

and wherein $R_1$ and $R_2$ are independently selected from monovalent organic groups having 1 to 18 carbon atoms, $R_3$ is a divalent organic group having 1 to 18 carbon atoms, and n is an integer of from 1 to 100.

7. The composition of claim 2, wherein $R_1$ and $R_2$ may be the same or different.

8. The composition of claim 7, wherein $R_1$ and $R_2$ have 1 to 6 carbon atoms.

9. The composition of claim 8, wherein $R_1$ and $R_2$ are selected from the group consisting of alkyl groups, cycloalkyl groups, aryl groups, and substituted forms of these groups, wherein some or all of the hydrogen atoms are replaced by halogen atoms.

10. The composition of claim 9, wherein said alkyl groups are selected from the group consisting of methyl, ethyl, propyl, and butyl groups; said cycloalkyl group is a cyclohexyl group; and said aryl groups are selected from the group consisting of phenyl and tolyl groups.

11. The composition of claim 2, wherein $R_3$ has 1 to 7 carbon atoms.

12. The composition of claim 11, wherein $R_3$ is selected from the group consisting of alkylene, arylene, and aralkylene groups, in which an oxygen or sulfur atom may be present.

13. The composition of claim 12, wherein $R_3$ is selected from the gorup consisting of —$CH_2$—, —$CH_2CH_2$—, —$CH_2CH_2CH_2$—, —$(CH_2)_4$—, —$(CH_2)_6$,

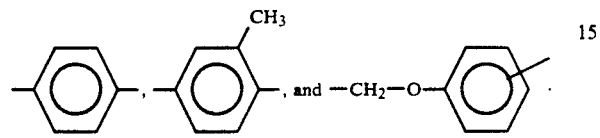

14. The composition of claim 13, wherein $R_3$ is selected from the group consisting of:

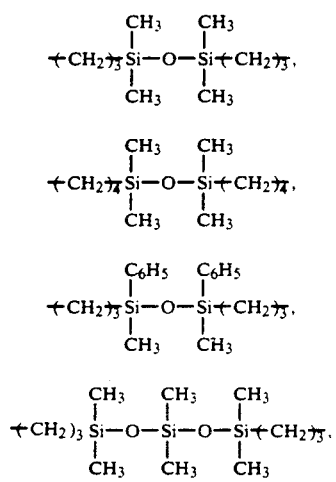

-continued

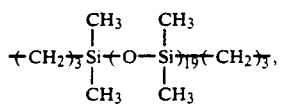

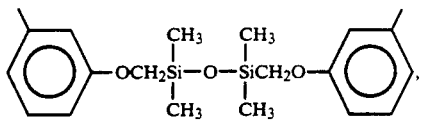

and

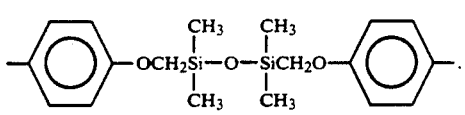

15. The composition of claim 1, wherein said polyimide resin consists essentially of 100 to 60 mol% of recurring units having formula (1).

16. The composition of claim 1, wherein Y is a residue of a tetracarboxylic acid dianhydride.

17. The composition of claim 1, wherein the content of the recurring units of formula (2) ranges from 0 to 40 mol% of the polyimide resin in proportion to the content of the recurring units of formula (1).

18. A substrate coated with a protective film which is formed from the polyimide resin solution composition of claim 1.

19. The coated substyrate of claim 18, wherein said substrate is an electronic part.

20. The coated substrate of claim 19, wherein said substrate is selected from the goup consisting of semiconductor elements, diodes, thyristors, transistors, wire shielding films and interlaminar insulating films for VLSI, ion implantation masks, printed circuit boards, liquid crystal display elements, fiber glass, and solar batteries.

* * * * *